United States Patent [19]
Liu

[11] Patent Number: 5,752,260
[45] Date of Patent: May 12, 1998

[54] HIGH-SPEED, MULTIPLE-PORT, INTERLEAVED CACHE WITH ARBITRATION OF MULTIPLE ACCESS ADDRESSES

[75] Inventor: Peichun Peter Liu, Austin, Tex.

[73] Assignee: International Business Machines Corporation, Armonk, N.Y.

[21] Appl. No.: 638,655

[22] Filed: Apr. 29, 1996

[51] Int. Cl.$^6$ .................................................. G06F 13/00
[52] U.S. Cl. .................... 711/129; 711/3; 711/118; 711/127; 711/129; 711/131; 711/210
[58] Field of Search ............................ 395/454, 458, 395/445, 456, 420, 403

[56] References Cited

U.S. PATENT DOCUMENTS

| | | | |
|---|---|---|---|
| 4,056,845 | 11/1977 | Churchill, Jr. | 395/454 |
| 4,716,545 | 12/1987 | Whipple et al. | |
| 4,933,846 | 6/1990 | Humphrey et al. | |
| 4,994,963 | 2/1991 | Rorden et al. | |
| 5,155,854 | 10/1992 | Flynn et al. | |
| 5,168,547 | 12/1992 | Miller et al. | |
| 5,179,702 | 1/1993 | Spix et al. | |
| 5,255,374 | 10/1993 | Aldereguia et al. | |
| 5,265,211 | 11/1993 | Amini et al. | |
| 5,299,147 | 3/1994 | Holst. | |
| 5,301,282 | 4/1994 | Amini et al. | |
| 5,530,822 | 6/1996 | Beavers et al. | 395/417 |
| 5,530,824 | 6/1996 | Peng et al. | 395/417 |
| 5,535,351 | 7/1996 | Peng | 395/417 |
| 5,550,995 | 8/1996 | Barrera et al. | 395/403 |
| 5,559,986 | 9/1996 | Alpert et al. | 395/471 |
| 5,581,734 | 12/1996 | DiBrino et al. | 395/496 |
| 5,596,740 | 1/1997 | Quattromani et al. | 395/484 |
| 5,604,879 | 2/1997 | Beavers et al. | 395/417 |

OTHER PUBLICATIONS

IBM Technical Disclosure Bulletin, vol. 23, No. 7B, Dec. 1980, "Odd/Even Interleave Cache With Optimal Hardware Array Cost, Cycle Time And Variable Data Port Width".

IBM Technical Disclosure Bulletin, vol. 29, No. 9, Feb. 1987, "Second–Level Cache With Compact Directory".

IBM Technical Disclosure Bulletin, vol. 31, No. 11, Apr. 1989, "Direct Memory Access For Multiple Requesting Computer Devices".

IBM Technical Disclosure Bulletin, vol. 33, No. 7, Dec. 1990, "High–Performance Combined Data/Address Memory Test".

IBM Technical Disclosure Bulletin, vol. 34, No. 1, Jun. 1991, "Design For A Backing Storage For Storage Protection Data".

IBM Technical Disclosure Bulletin, vol. 34, No. 4B Sep. 1991, "Data Combining For Cache Accesses".

IBM Technical Disclosure Bulletin, vol. 34, No. 4B, Sep. 1991, "Resolution Of Cache Directory Collision".

IBM Technical Disclosure Bulletin, vol. 36, No. 4, Apr. 1993, "Multisequencing A Single Instruction Stream Cache Concurrency Requirements".

IBM Technical Disclosure Bulletin, vol. 36, No. 6B, Jun. 1993, "Smart Burst—Dual Bus Control For Improved Personal Computer Performance".

IBM Technical Disclosure Bulletin, vol. 36, No. 8, Aug. 1993, "Interleaved Memory Dual Bus Data Selector".

*Primary Examiner*—Frank J. Asta
*Attorney, Agent, or Firm*—Mark E. McBurney; Andrew J. Dillon

[57] ABSTRACT

A cache memory for a computer uses content-addressable tag-compare arrays (CAM) to determine if a match occurs. The cache memory is partitioned in four subarrays, i.e., interleaved, providing a wide cache line (word lines) but shallow depth (bit lines). The cache can be accessed by multiple addresses, producing multiple data outputs in a given cycle. Two effective addresses and one real address are applied at one time, and if addresses are matched in different subarrays, or two on the same line in a single subarray, then multiple access is permitted. The two content-addressable memories, or CAMs, are used to select a cache line, and in parallel with this, arbitration logic in each subarray selects a word line (cache line).

12 Claims, 6 Drawing Sheets

HIGH-SPEED, MULTIPLE-PORT, INTERLEAVED CACHE WITH ARBITRATION OF MULTIPLE ACCESS ADDRESSES

RELATED CASES

This application discloses subject matter related to the following co-pending applications which are assigned to International Business Machines Corporation, the assignee of this disclosure:

Ser. No. 08/173,448, filed Dec. 22, 1993, (Docket No. AT9-92-131) abandoned in favor of File Wrapper Continuation Ser. No. 08/658,13, filed May 31, 1996;

Ser. No. 08/319,201, filed Oct. 5, 1994, by Peichun P. Liu et al., for "Method and System for Miss Sequence Handling in a Data Cache Array Having Multiple Content Addressable Fields Per Cache Line" (Docket No. HQ9-94-023);

Ser. No. 08/319,202, filed Oct. 5, 1994, by Peichun P. Liu et al., for "Method and System for Efficient Miss Sequence Cache Line Allocation" (Docket No. HQ9-94-025);

Ser. No. 08/638,661, filed Apr. 29, 1996, (AA9-95-094) by Peichun P. Liu et al., for "Improved Cache Sub-Array Arbitration."

BACKGROUND

1. Technical Field

The present disclosure relates in general to data processing systems and in particular to cache memory systems for high-speed processors. Still more particularly, the present disclosure relates to cache memory devices using content-addressable tag compare, and having multiple accesses to the cache within a processor cycle.

2. Description of the Related Art

In a high-speed processor such as a superscalar RISC design, where more than one instruction is executed during a machine cycle, multiple operations into a cache memory are desirable. The processor may have to access more than one effective address and real address in one cycle. The accesses are thus interleaved. In prior interleaved cache memory designs, the interleaving is done by interleaving the high order address bits of the cache line offset; that is, a cache array is often subdivided into multiple subarrays (memory banks) to achieve parallel access. Multiple copies of the tag storage array are required to satisfy multiple requests. Here the bit line loading is greater since there are a large number (e.g., 512) memory cells to share the same pair of bit lines. It is proposed in accordance with a feature of the present disclosure to interleave the cache line instead of interleaving the doublewords of a cache line.

In an interleaved data cache design, the arbitration for multiple requests may slow down the cache access. First, the multiple requests must be arbitrated, to decide which ones go first, then the address selected by the arbitration logic is used to select a cache line and select data within the cache line. This has resulted in delays that are not consistent with high performance.

SUMMARY

It is therefore one object of the present disclosure to provide an improved cache memory for a high-speed data processing system.

It is another object of the present disclosure to provide a cache memory which allows multiple (interleaved) access at high speed.

The above as well as additional objects, features, and advantages of the present disclosure will become apparent in the following detailed written description.

According to the disclosure, a cache memory uses content-addressable tag-compare arrays (CAM) to determine if a match occurs. The cache memory is partitioned in four subarrays, i.e., interleaved, providing a wide cache line (word lines) but shallow depth (bit lines), lowering the bit line loading. The cache has the capability of being accessed by more than one address, producing more than one data output in a given cycle. Two effective addresses and one real address may be applied to the cache memory at one time, and if the addresses are matched in different subarrays, or two on the same line in a single subarray, then multiple access is permitted. There need be only one copy of the real address tag store for all parallel requests.

A feature of the disclosure, then, is the use of these two content-addressable portions in the data memory arrays, one for real addresses and one for effective (untranslated) addresses. These two content-addressable memories, or CAMs, are used to select a cache line, and in parallel with this, arbitration logic in each subarray select a word line (cache line).

One of the important features of the data cache array of the disclosure is the four-way interleaving organization. The data cache is interleaved by four subarrays (or, some larger number might be used). Three addresses can access the data cache array in the same cycle. Each address is on behalf of a particular cycle type. Two effective addresses, called EA0 and EA1, and one real address or RA bits select the subarrays. If subarray select fields of any two addresses contain the same value, then these two addresses have a subarray conflict and some predefined priority is used to allow the higher priority one to access the subarray. The constraint that one subarray can be accessed by only one address is due to the fact that there can be only one word line enabled in one subarray in any one cycle. If these three address (EA0, EA1, RA) contain three different values in a the subarray select field, then three different operations can happen in the same cycle at three different subarrays. For example, while a ECAM read on behalf of the EA0 address is accessing the subarray 0, another ECAM read on behalf of an EA1 address may be accessing subarray 1, and a store cycle on behalf of a real address RA is accessing the subarray 2.

BRIEF DESCRIPTION OF THE DRAWINGS

The novel features believed characteristic of the disclosure are set forth in the appended claims. The disclosure itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
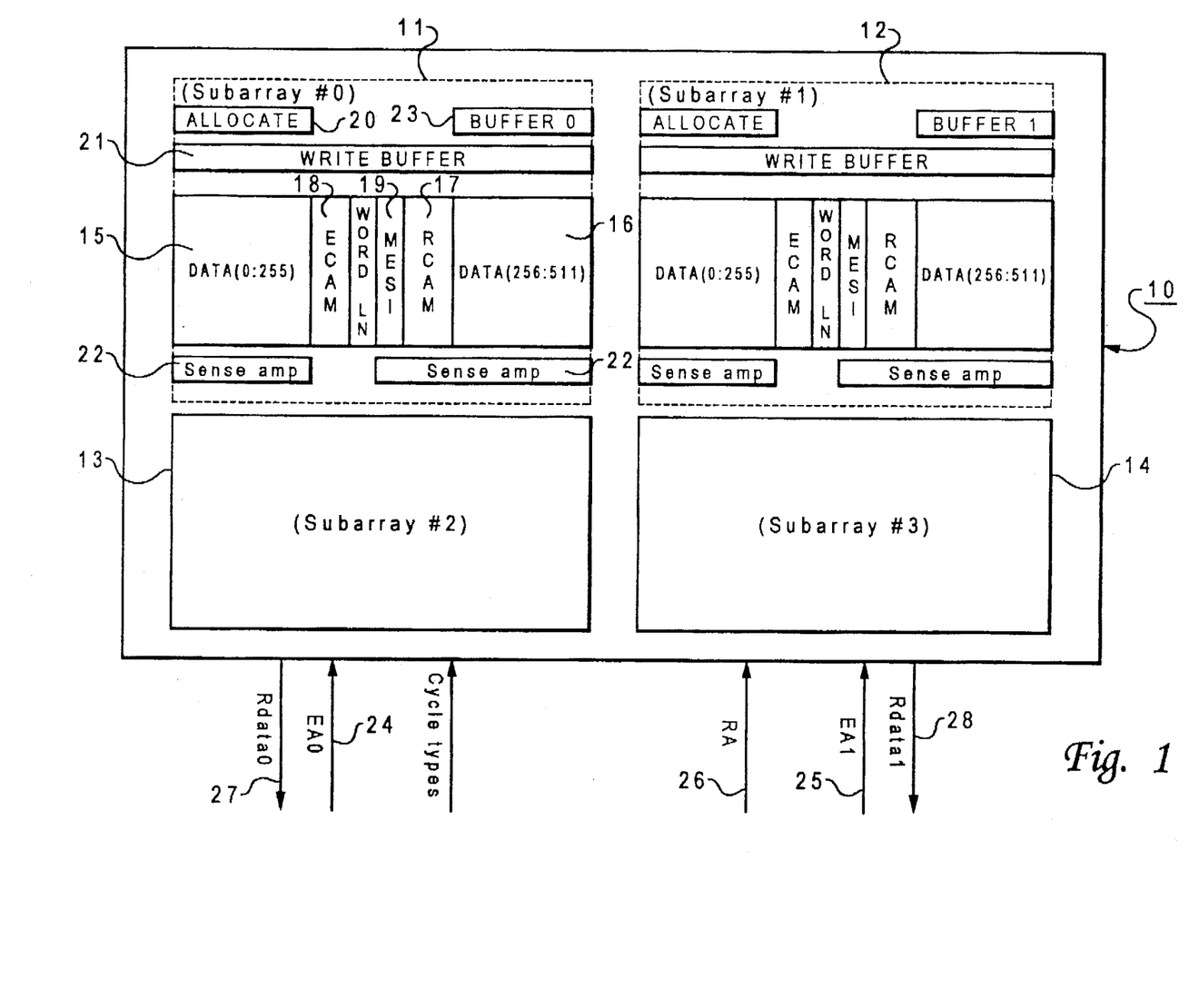
FIG. 1 is a diagram of a cache memory having four subarrays, in accordance with an embodiment of the present disclosure.

Referring to FIG. 1, a block diagram of a cache memory device 10 having multiple subarrays is shown which may incorporate features of the illustrative embodiment. In one embodiment, this memory 10 is a static RAM device, with address-compare circuitry configured as content-addressable memory elements, and this memory is used as a data cache in a microprocessor chip, as will be described. The memory 10 is physically divided into (in this example) four subarrays 11, 12, 13 and 14, and these subarrays are also labelled Subarray #0, Subarray #1, Subarray #2, and Subarray #3. The subarrays are of identical construction, and so only one will be described. Each subarray contains two data cell arrays 15 and 16, each containing 512 data or bit line pairs (vertical lines in the drawing), and 128 word lines (horizontal lines in the drawing), in the data storage portion of a subarray. Thus, each subarray is 512+512 or 1024-bits wide and 128-bits deep, so contains 128K-bits or 16K-bytes. The 128 memory cells in the same column share the same pair of bit lines and form a bit of a cache line, and a word line accesses 1024 bits, so each subarray includes 128 cache lines; each cache line includes a 1024-bit data field, which is broken into two segments, one in cell array 15 and the other in cell array 16 within subarray 11. Each cache line also preferably includes a 128-bit parity field (not shown), as well as various address and control fields including a 28-bit RCAM field in area 17, a 9-bit ECAM field in area 18 and a 3-bit MESI field in area 19. Thus there are over 1100 bits on each word line.

The so-called "MESI" status bits refer to the control bits commonly utilized within data caches to signify valid, written, etc. The term "MESI" is an acronym which stands for "Modified," "Exclusive," "Shared," and "Invalid." Thus, the status of data within a particular cache line within a data cache such as memory 10 may be rapidly and efficiently determined by determining the status of these MESI bits in area 19. Similarly, the status of data within a cache may be altered by writing different bits into the MESI field in area 19. The MESI field is used for executing a LRU (least recently used) or other algorithm to decide which cache line to discard when doing a cache fill operation.

As depicted in FIG. 1, each subarray 11–14 includes an associated allocate buffer 20 and an associated write driver 21 which is utilized to drive data into a cache line within the array. Similarly, a sense amplifier 22 is provided for amplifying the output signals from a particular cache line. An output buffer stores the output data from a subarray until it is decided if it is to be used in a given cycle.

As illustrated by FIG. 1, by providing two separate and distinct content-addressable fields RCAM and ECAM in fields 17 and 18 within each cache line within the data cache array 11, the data within that cache line may be accessed in a number of efficient sequences.

The memory 10 may receive two 64-bit EA (effective) addresses EA0 and EA1 on lines 24 and 25, and one 40-bit RA (real) address on lines 26, at the same time. The memory, according to the illustrative embodiment, decides which two addresses are used to produce output data. Data output can be produced on two output buses 27 and 28 at the same time. That is, the memory 10 is capable of being simultaneously accessed by multiple ports for access in the same cycle. An address is applied to address decoders and the ECAM and RCAM fields for the four subarrays, to see if there is a match in tag fields, and bringing out data when there is a match, while at the same time deciding which data can be outputted, using arbitration.

Figure 2:
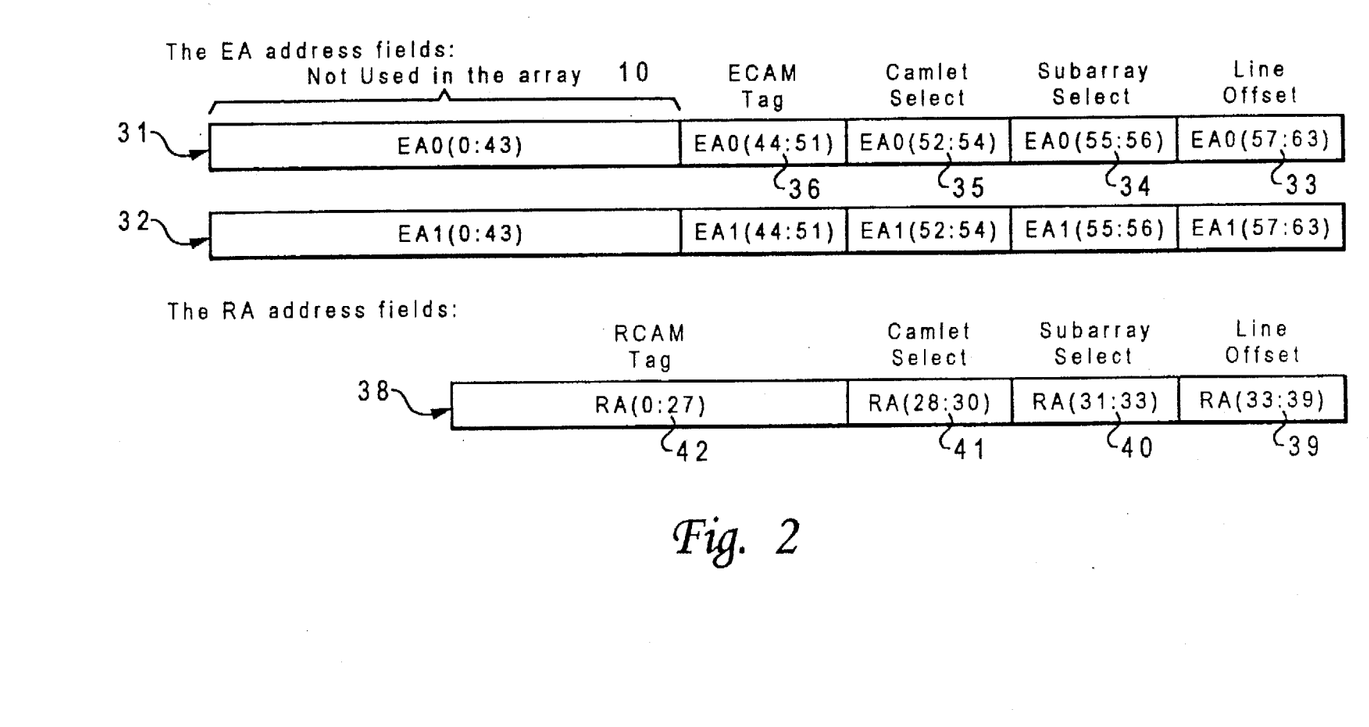
FIG. 2 is a diagram of the format of addresses applied to the cache memory of FIG. 1 by a processor.

Referring now to FIG. 2, there is depicted a graphic illustration of an addressing system for a particular microprocessor architecture, and which may be utilized within the system of the present illustrative embodiment, including use for addressing the cache memory 10 of FIG. 1. The two effective addresses 31 and 32 (or, in some architectures, these would be called virtual addresses), from lines 24 and 25, are graphically depicted within FIG. 2. Effective addresses 31 and 32 each preferably include 64-bits; however, bits 0–43 are not utilized within the data cache array of the present illustrative embodiment. As depicted, a field 33, bits 57–63, represent the line offset of the effective address. A two-bit field 34, bits 55–56, is utilized to select one of four subarrays 11–14 within the data cache memory 10 of the present illustrative embodiment. A three-bit field 35, bits 52–54, is utilized to select one-of-eight camlets within each subarray 11–14. In the illustrative embodiment of the present illustrative embodiment each "camlet" comprises sixteen cache lines of the data cache array, which are laid out in a manner which will be explained herein. Finally, a nine-bit field 36 of the effective address, bits 44–51, forms a tag to compare with a content-addressable memory field referred to herein as the "ECAM" tag present within each cache line of the data cache array 11–14.

An example of a 40-bit real address or RA 38 which may be utilized with the system of the present illustrative embodiment is also shown in FIG. 2. As above, a seven-bit field 39, bits 33–39, are the line offset for the real address. A 2-bit field 40, bits 31–32, is utilized to select one of the four subarrays 11–14 within the data cache memory 10 of the present illustrative embodiment and a three-bit field 41, bits 28–30, is utilized to select a particular one of the eight camlets within each subarray. Finally, a 28-bit field 42 of the real address for an associated block of information are stored within a second content-addressable field 17 in a cache line, referred to herein as "RCAM". During any comparison between a desired address and the portions of the address stored within the ECAM field in area 18 and the RCAM field in area 17, the bits identifying the camlet 41 must also be compared.

Thus, in accordance with the addressing system depicted within FIG. 2, each block of information within a system which incorporates the data cache memory 10 of the present illustrative embodiment will include two separate and distinct content-addressable fields which may be utilized in conjunction with either a portion of the effective address or a portion of the real address to select a block of information within the cache array, in four separate subarrays.

Figure 3:
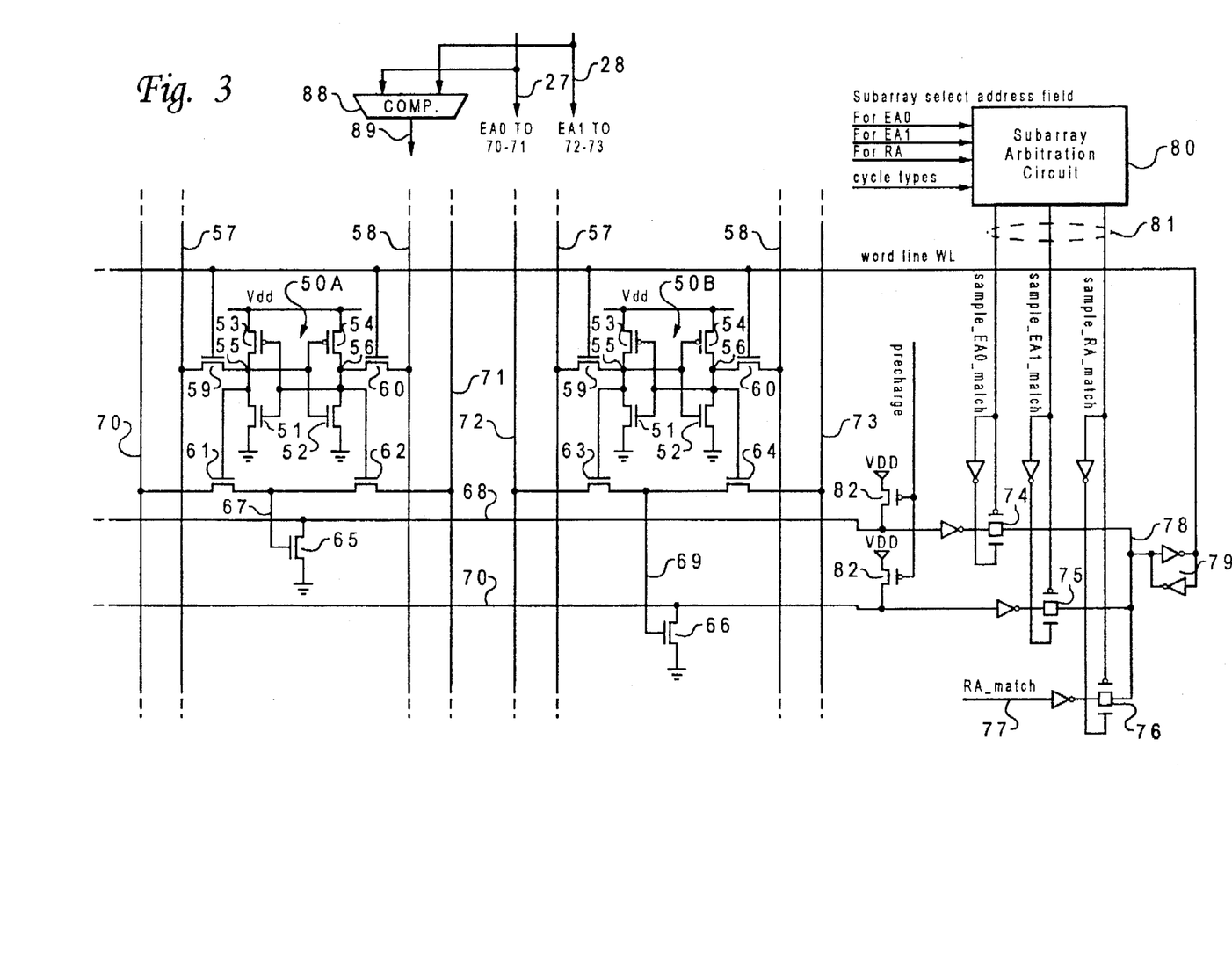
FIG. 3 is an electrical schematic diagram of a part of the cache memory of FIG. 1.

With reference now to FIG. 3, there is depicted a schematic electrical circuit diagram of an example of two of the CMOS CAM cells provided in accordance with one embodiment of the present illustrative embodiment along with associated match circuitry. The CAM cells 50A and 50B each include a six transistor SRAM memory cell having cross-coupled N-channel driver transistors 51 and 52 and P-channel load transistors 53 and 54, and is similar to the cells used in the data cell arrays 15 and 16. These cells 50A and 50B as shown are part of one of the ECAM content-addressable areas 18 of the memory device. Data input/output nodes 55 and 56 of each CAM cell are connected to bit lines 57 and 58 via coupling transistors 59 and 60, by activation of a word line WL which is connected to the gates of transistors 59 and 60. The circuit of FIG. 3 contains additional logic for comparison, and XOR function. Two separate XOR logic circuits, one for cell 50A using the two transistors 61 and 62 and the other for cell 50B using the two transistors 63 and 64, are inputs to the gates of separate transistors 65 and 66. The gates of transistors 61 and 62 and the gates of transistors 63 and 64 are driven from the output nodes 55 and 56 of the cells 50A and 50B. The two inputs of the XOR logic are connected to a reference line pair and the output to represents a match line. The output node 67 of the first XOR logic circuit is connected to an EA0__match line 68, and likewise the output node 69 of the second XOR logic circuit is connected to an EA1__match line 70. Further inputs to the XOR logic circuits are two separate sets of reference lines 70 and 71 (for EA0), and 72 and 73 (for EA1). These reference lines 70–73 represent true-and-compliment bits from the address inputs 24 and 25 of FIG. 1. Outputs from the XOR logic circuits on match lines 68 and 70 are inverted and connected to a single latched output to word line WL, using a sampling arrangement including three separate pairs of P- and N-channel pass transistors 74, 75 and 76. Only one of the match lines 68, 70, or RA match 77 is allowed to produce an output to node 78, and this output is stored in latch 79, to drive the wordline WL. One of the three sets of pass transistors 74–76 is selected by an arbitration circuit 80 using lines 81. For a given wordline, only one of the three possible address matches (two EA addresses and one RA address) is allowed to drive the wordline 61 and thus produce a data output from a given subarray, unless two EA Addresses happen to be on the same wordline, in which case two EA addresses will be used at the same time to produce two data outputs.

In operation of the circuit of FIG. 3, all of the reference line pairs 70, 71 or 72, 73 are forced low, and match lines 68 and 70 are precharged high through transistors 82, before the beginning of a cycle. Next, the reference line pairs 70, 71 and 72, 73 are driven by a valid address being inputted via lines 24 and 25, so one line goes high and the other stays low in each pair; this begins the comparison. If the data on a reference line does not match the data stored within a CAM cell (as it appears on nodes 55 and 56), a match line 68 or 70 will be discharged through the corresponding transistors 61–64 and 65 or 66. However, if the address bits on a reference line pair do match the data stored within a CAM cell, one of the match lines 68 or 70 will remain in the precharged condition. The condition of match line 68 or 70 is latched in latch 79 and the reading or writing of data may thereafter continue while the word line WL is held in the high condition. The RCAM and ECAM may be set up for the next cycle while readout of data occurs. Utilizing both a bit line pair 57 and 58 and reference line pairs 70–73 within selected CAM cells make it possible to do a compare and read/write tags during the same clock cycle.

Figure 4:
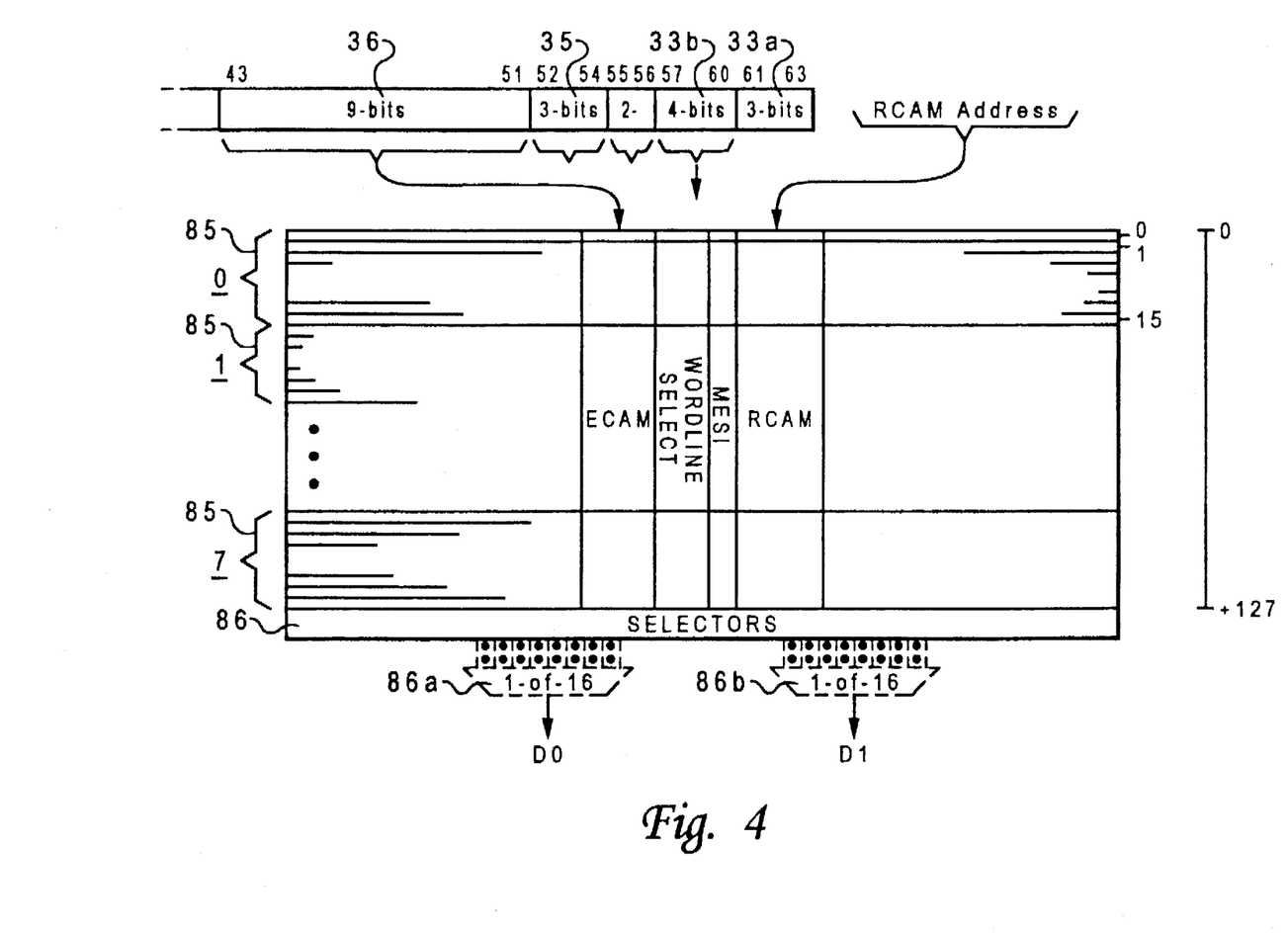
FIG. 4 is an enlarged view of one of the subarrays of the cache memory of FIG. 1.

Referring to FIG. 4, a more detailed diagram of one of the subarrays 11–14 is illustrated. The data part of the subarray is 1024-bits wide, split in half with half of the cells in cell array 15 and half in cell array 16; each horizontal line is a cache line. The cache lines are numbered 0–127, each being in the form of a word line, and these 128-lines are split into eight camlets 85. Looking at the effective address 31 or 32 of FIG. 2 in more detail, the line offset field 33 contains a 3-bit byte-select field 33a which is not used in the memory 10, but which in the CPU selects 1-of-8 bytes within a selected double word (a double word is 64-bytes). A 4-bit field 33b, bits 57–60, selects 1-of-16 double words within a cache line, using a 1-of-16 multiplexer, in a bitline selector in a decoder 86. A 2-bit field 34 selects 1-of-4 of the subarrays 11–14, and a 3-bit field 35 selects 1-of-8 camlets 85 within a subarray, using a part of the word-line selector 87. The 9-bit ECAM tag 36 is compared by the content-addressable memory portion 18 using the circuit of FIG. 3. There may be two incoming effective addresses EA0 and EA1, and one of these is selected in each subarray either using the selection circuitry including the lines 70–73 of FIG. 3 or using a selector outside the cell array as will be explained. The selector 86 in effect includes two multiplexers 86a and 86b to select two double words from the 1024 bits of a cache line, and these two double words can be selected from those three addresses by the contents of incoming EA0, EA1, and RA addresses on lines 24, 25 and 26 of FIG. 1. An arbitration/priority circuit 80 receives signals on lines 87 indicating the presence of incoming addresses and the cycle types, from the CPU, and selects which addresses are used, if there are conflicting requests.

The two EA addresses EA0 and EA1 incoming on lines 27 and 28 are applied to the ECAMs in each of the four quadrants or subarrays of the memory 10 via the lines 70–73 of FIG. 3, and are also applied to a duplicate detector in the form of a comparator 88. If the two addresses are the same, then an output 89 is used to cause two 64-bit double-word data items to be selected from the same subarray, using the selectors 86a and 86b.

An important feature is that the process of matching the tags and addressing the array of data cells and producing a potentially-usable data output can proceed while the arbitration and selection of output data is going on in parallel. That is, these processes are not sequential, and so speed is enhanced. While the arbitration (priority) circuit is generating an output saying which of the three addresses is to produce data output, the parallel process of finding if there is a match is proceeding independently.

Figure 5:
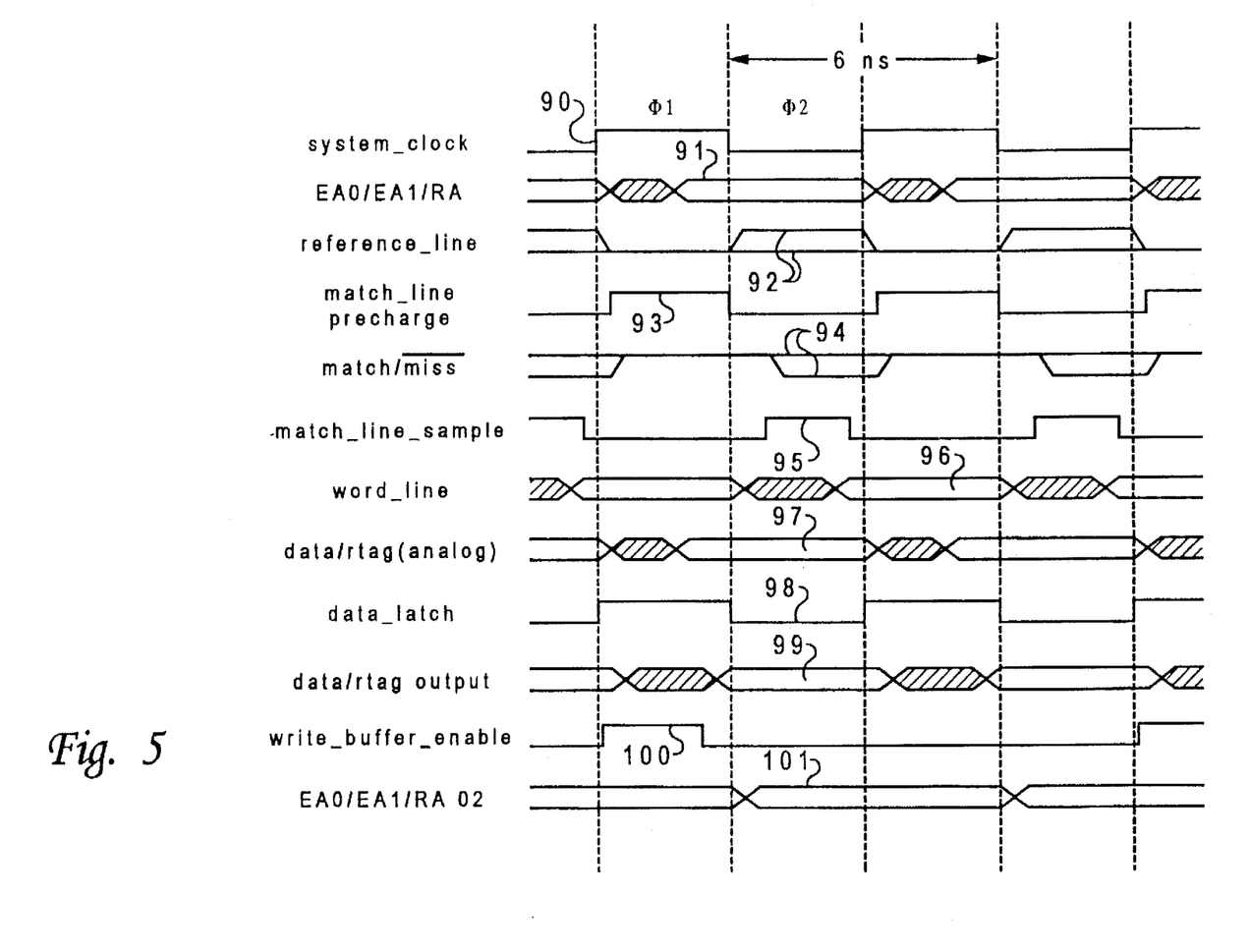
FIG. 5 is a timing diagram of waveforms of voltages plotted as a function of time, appearing in the operation of the cache memory of FIGS. 1-4.

A timing diagram of voltage waveforms and the like used in operation of the cache memory of FIGS. 1–4 is illustrated in FIG. 5. A processor cycle includes two phases $\phi1$ and $\phi2$, and it is noted that in one example the machine cycle time is 6-ns. The system clock is shown as a line 90 at the top of FIG. 5. The addresses EA0, EA1, and RA appear valid on input lines 24, 25, and 26 of the cache memory 10 as shown by the line 91; that is, the addresses are all valid beginning at midpoint of $\phi1$ through the end of $\phi2$, in each cycle. The reference lines 70–73 of FIG. 3 become valid (true and compliment) at the beginning of $\phi2$ and remain valid during all of $\phi2$ as seen by lines 92 of FIG. 5. The match lines 68 and 70 are precharged via transistors 82 during $\phi1$ as seen by line 93. The match-or-miss indication on lines 68 or 70 is valid at point 94 some time into $\phi2$ as seen in FIG. 5, and this stays valid through $\phi2$. The sample signals at the output of the priority circuit 80 are active at times 95 during $\phi2$, so the word line 61 is driven to its valid condition after a delay from interval 95, coming valid at the end of $\phi2$ and staying valid through the end of $\phi1$ of the next cycle, as seen by period 96. The data or tag from a cell appears on the bit lines 57, 58, during time interval 97, then is latched to a buffer during time 98 by a data latch signal. Data is thus valid at the output lines 27, 28, or 29 during time 99 of FIG. 5. All this description of FIG. 5 so far has assumed a read cycle. For a write cycle, in $\phi1$ a write buffer enable signal occurs as seen by line 100, and the addresses for write data should be as seen in the signal 101. That is, transitions are allowed at the $\phi1$-$\phi2$ transition.

Figure 6:
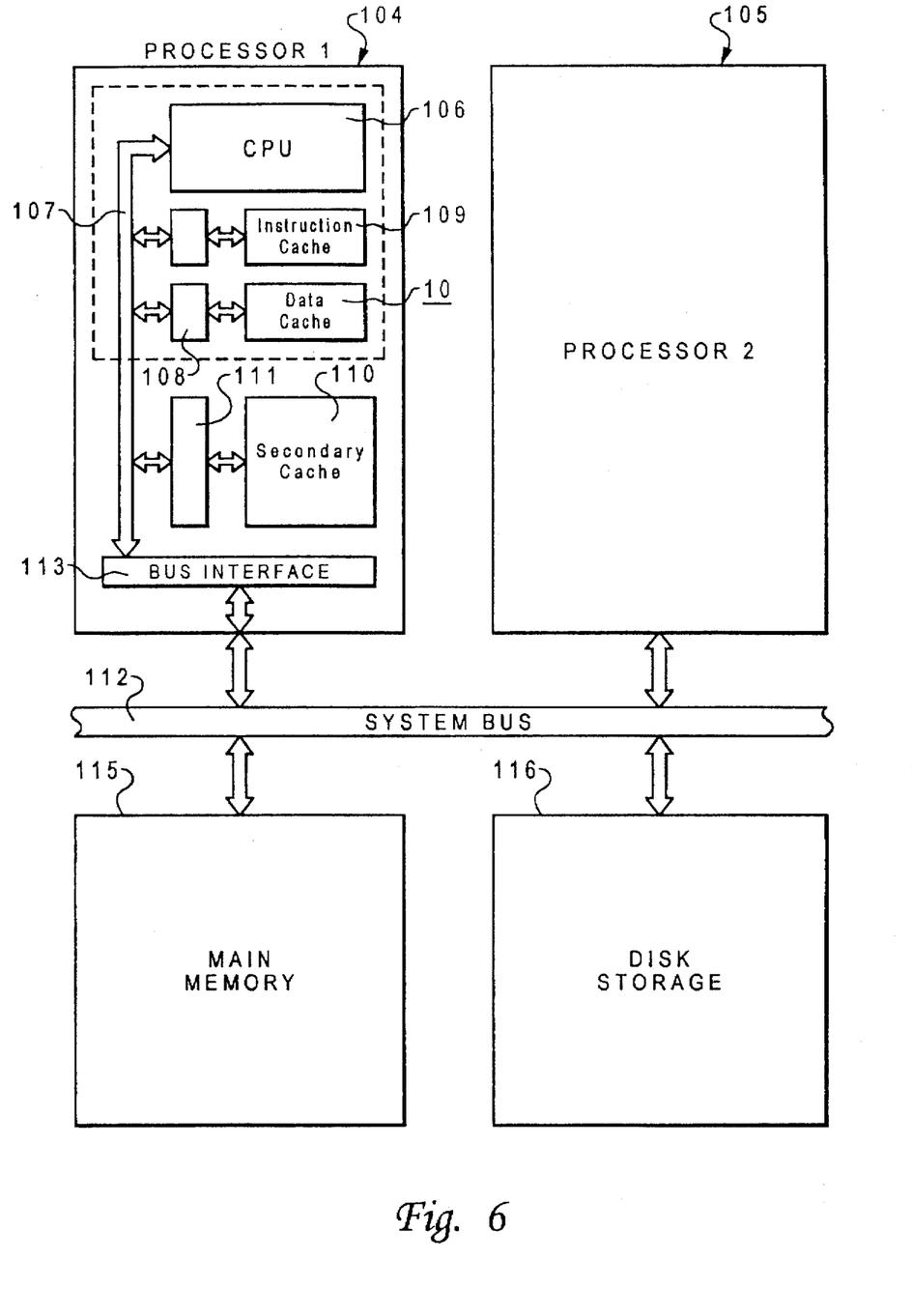
FIG. 6 is a block diagram of a data processing system of the type using a cache memory according to the disclosure.

Referring to FIG. 6, a data processing system of the type using a cache memory according to the illustrative embodiment is illustrated. Of course, it is understood that the features of the illustrative embodiment are useful in various systems, as primary (first level) cache, secondary cache, translation buffers, and the like, wherever a content-addressable memory is useful, or wherever multiple access, multiple-port memory is needed. In FIG. 6, two processors 104 and 105 are shown, although the features of this illustrative embodiment are also useful in a single processor system. The processor 104 has a CPU 106 which may be of the superscalar RISC type, for example, constructed as a single-chip device with an on-chip data cache 10 as described herein. The data cache is connected to a local bus 107 by a cache controller 108. The processor chip would usually also have an instruction cache 109 with its cache controller, connected to the CPU by separate paths within the local bus structure. A secondary cache 110, off-chip, is also connected to the local bus 107 by a cache controller 111. The secondary cache 110 is usually much larger than the on-chip cache 10, and access to it is somewhat slower than to the on-chip caches 10 and 109. As noted above, the cache 10 is addressed by effective (i.e., untranslated) addresses EA0 and EA1, as well as by real (physical) addresses RA. Thus, the local bus 107 within the processor chip has a number of address buses, including two effective address buses, as well as real address buses and instruction address buses. The secondary cache is usually addressed only by real addresses. The CPU is connected to a system bus 112 by a bus interface 113, so translations in timing and controls are made to the system bus standards from the local busses. A main memory 115 and a disk storage system 116 are usually couple to the system bus. The memory is thus hierarchical from fastest to slowest, and from smallest to largest, and from most expensive (per byte), in progression from the on-chip caches 10 and 109, to the secondary cache 110, to the main memory 115, to the disk storage 116. The main memory 115 usually contains a subset of what is in the disk storage 116, the secondary cache 110 contains a subset of what is in main memory 115, and the on-chip caches 10 and 109 subsets of what is in the secondary cache. The CPU can access the on-chip cache 10 within an cycle, whereas it takes several cycles to access the secondary cache 110. If a cache miss occurs in primary and secondary caches, then the main memory 115 is accessed to do a cache fill operation, replacing a cache line with a 1024-bit portion from main memory containing the addressed data. This cache fill is usually used to satisfy the attempted access for which a cache miss occurred. If the main memory 115 does not contain the location for which a cache fill is attempted, then a page containing this data is accessed from disk storage 116, then the cache fill is completed and the memory access satisfied. The time required to acquire a page from disk and write it to main memory would be many thousands of CPU cycles, during which the CPU is ordinarily switched to do another task, or stalled, waiting for the data to satisfy the request.

While the disclosure has been particularly shown and described with reference to a preferred embodiment, it will be understood by those skilled in the art that various changes in form and detail may be made therein without departing from the spirit and scope of the disclosure.

What is claimed is:

1. A method of operating a cache memory having a plurality of subarrays of memory cells, each subarray containing a plurality of cache lines, said method comprising the steps of:

storing tags in each subarray in at least two content-addressable arrays for at least two types of addresses;

applying at least three addresses, including at least one address of each of said at least two types, to said subarrays during a given cycle, receiving said at least three said addresses at one time in each subarray by said content-addressable arrays, and comparing said addresses with tags stored in said content-addressable arrays, arbitrating said at least three addresses, and selecting one of said at least three addresses for a subarray if a conflict appears between the addresses.

2. A method according to claim 1 including the step of:

comparing at least two of said addresses and producing a match signal if two of said addresses are the same, and, if said match signal occurs, outputting two accessed data blocks from a single cache line from a selected one of said arrays.

3. A method according to claim 1 wherein said at least three addresses include at least two effective addresses and at least one real address, in a virtual memory system.

4. A method according to claim 1 wherein said step of receiving and said step of arbitrating are performed in each subarray at the same time.

5. A method according to claim 2 wherein said step of receiving, said step of arbitrating, and said step of comparing are all performed in each subarray at the same time.

6. A method according to claim 1 wherein there are at least four of said subarrays, and each subarray contains a number of cache lines which is much less than the number of bits in a cache line.

7. A cache memory comprising:

at least four subarrays of memory cells, each subarray containing a plurality of cache lines;

means for applying at least three addresses to said subarrays during a given cycle, each subarray containing at least two content-addressable arrays for receiving said at least three addresses at one time for comparison of said addresses with tags stored in said content-addressable arrays, arbitration means receiving signals associated with said at least three addresses, and producing a selection of one of said at least three addresses if a conflict appears between the addresses.

8. A system according to claim 7 including:

comparator means for receiving at least two of said addresses and for producing a match signal if two of said addresses are the same, and, if said match signal occurs, means for outputting two accessed data blocks from a single cache line from a selected one of said arrays.

9. A system according to claim 7 wherein said at least three addresses include at least two effective addresses and at least one real address, in a virtual memory system.

10. A system according to claim 1 wherein said receiving and said arbitrating are performed in each subarray at the same time.

11. A system according to claim 8 wherein said receiving, said arbitrating, and said comparing are all performed in each subarray at the same time.

12. A system according to claim 1 wherein there are at least four of said subarrays, and each subarray contains a number of cache lines which is much less than the number of bits in a cache line.

* * * * *